US011404326B2

(12) United States Patent
Yoo

(10) Patent No.: US 11,404,326 B2
(45) Date of Patent: Aug. 2, 2022

(54) SEMICONDUCTOR DEVICE AND METHOD FOR FABRICATING THE SAME

(71) Applicant: SK hynix Inc., Gyeonggi-do (KR)

(72) Inventor: Keon Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 12 days.

(21) Appl. No.: 17/068,351

(22) Filed: Oct. 12, 2020

(65) Prior Publication Data

US 2021/0358815 A1 Nov. 18, 2021

(30) Foreign Application Priority Data

May 18, 2020 (KR) .................. 10-2020-0059191

(51) Int. Cl.
*H01L 21/8238* (2006.01)
*H01L 27/092* (2006.01)
*H01L 29/06* (2006.01)
*H01L 29/49* (2006.01)
*H01L 21/3215* (2006.01)
*H01L 21/32* (2006.01)
*H01L 21/28* (2006.01)

(52) U.S. Cl.
CPC ........... *H01L 21/823828* (2013.01); *H01L 21/28061* (2013.01); *H01L 21/32* (2013.01); *H01L 21/32155* (2013.01); *H01L 21/823821* (2013.01); *H01L 21/823878* (2013.01); *H01L 27/0924* (2013.01); *H01L 29/0653* (2013.01); *H01L 29/4941* (2013.01)

(58) Field of Classification Search
CPC ....... H01L 21/823828; H01L 21/28061; H01L 21/32; H01L 21/32155; H01L 21/823821; H01L 21/823878; H01L 27/0924; H01L 29/0653; H01L 29/4941; H01L 27/092; H01L 21/823842
See application file for complete search history.

(56) References Cited

U.S. PATENT DOCUMENTS

| | | | |
|---|---|---|---|
| 6,342,438 B2 | 1/2002 | Yu et al. | |
| 8,039,338 B2 | 10/2011 | Horstmann et al. | |
| 9,397,174 B2 | 7/2016 | Ellis-Monaghan et al. | |
| 2015/0035076 A1* | 2/2015 | Ellis-Monaghan ... | H01L 29/408 257/369 |

* cited by examiner

*Primary Examiner* — Karen Kusumakar
*Assistant Examiner* — Adam S Bowen
(74) *Attorney, Agent, or Firm* — IP & T Group LLP

(57) ABSTRACT

A semiconductor device includes a substrate including a first active region, a second active region, and an isolation region positioned between the first active region and the second active region; and a gate layer crossing over the first active region, the second active region, and the isolation region, wherein the gate layer includes a first impurity doped portion overlapping with the first active region, a second impurity doped portion overlapping with the second active region, and a diffusion barrier portion positioned between the first impurity doped portion and the second impurity doped portion.

26 Claims, 12 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2020-0059191, filed on May 18, 2020, which is incorporated herein by reference in its entirety.

BACKGROUND

1. Field

Various embodiments of the present invention relate generally to a semiconductor device and a method for fabricating the same, and more particularly, to a semiconductor device applying a dual polysilicon gate, and a method for fabricating the semiconductor device.

2. Description of the Related Art

In a recent CMOS fabrication process, when a polysilicon gate electrode is used, a Dual Poly Gate (DPG) that induces a threshold voltage of a transistor to a predetermined range by implanting an N type impurities to an NMOS region and a P type impurities to a PMOS region to match their work function, is being applied.

The dual poly gate, however, has a problem in that the implanted impurities may be diffused out of the gate region into an adjacent region by a subsequent heat process which may deteriorate the performance of opposite type transistors.

SUMMARY

Embodiments of the present invention are directed to a semiconductor device capable of preventing deterioration in the performance of a transistor, and a method for fabricating the semiconductor device.

In accordance with an embodiment of the present invention, a semiconductor device includes: a substrate including a first active region, a second active region, and an isolation region positioned between the first active region and the second active region; and a gate layer crossing over the first active region, the second active region, and the isolation region, wherein the gate layer includes a first impurity doped portion overlapping with the first active region, a second impurity doped portion overlapping with the second active region, and a diffusion barrier portion positioned between the first impurity doped portion and the second impurity doped portion.

In accordance with another embodiment of the present invention, a method for fabricating a semiconductor device includes: providing a substrate including a first active region, a second active region, and an isolation region positioned between the first active region and the second active region; forming a gate layer crossing over the first active region, the second active region, and the isolation region; forming a first impurity doped portion in the gate layer overlapping with the first active region; forming a second impurity doped portion in the gate layer overlapping with the second active region; and forming a diffusion barrier portion in the gate layer between the first impurity doped portion and the second impurity doped portion.

In accordance with another embodiment of the present invention, a semiconductor device includes: an isolation region positioned between a first active region and a second active region; and a gate layer including a first and second impurity doped portions separated by a diffusion barrier portion, wherein the first impurity doped portion is formed over the first active region and extends over an edge of the first active region facing the isolation region to partially overlap with the isolation region, wherein the second impurity doped portion is formed over the second active region and extends over an edge of the second active region.

DETAILED DESCRIPTION

Figure 1:
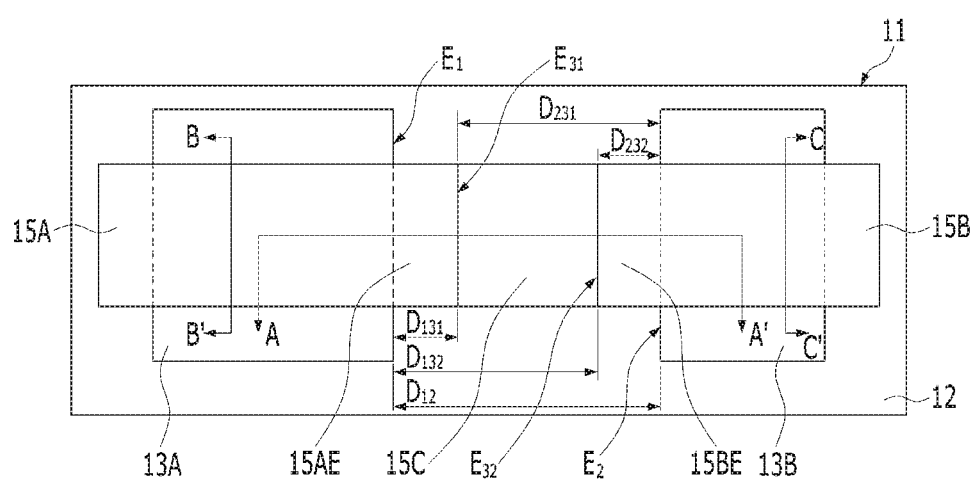
FIG. 1 is a plan view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

As used herein, singular forms are intended to include the plural forms as well, unless the context clearly indicates otherwise.

It should also be noted that features present in one embodiment may be used with one or more features of another embodiment without departing from the scope of the invention.

It is further noted, that in the various drawings, like reference numbers designate like elements.

The described embodiment of the present invention may be applied to a semiconductor device using a dual poly gate having a doped polysilicon gate with an NMOS region and a PMOS region that are separately formed by implanting impurities through an ion implantation process. The described process may be applied to most silicon semiconductor device fabrication processes, except for the fabrication processes of some high-performance semiconductor devices (for example, high-k metal gates) that includes metal gate electrodes and high-k dielectric layers as constituent elements.

The methods of forming a dual polysilicon gate may be roughly categorized into methods which implant an impurity simultaneously with the polysilicon deposition and methods which implant an impurity into each region after forming an undoped polysilicon gate.

A dual polysilicon gate forming method of implanting an impurity during a polysilicon deposition may be performed by Chemical Vapor Deposition. The dual polysilicon gate forming method may be performed by adding a gas containing a group-5 element, such as phosphorus (P), when a polysilicon layer is deposited so as to form a pre-doped N+ polysilicon layer on the profile, forming a mask that opens a PMOS region, and then forming a P+ polysilicon layer by implanting a group-3 element, such as boron (B). In order to form the P+ polysilicon layer in the PMOS region, it is necessary to convert most impurities of the PMOS region to boron through a counter doping process of doping more boron (B) than the phosphorus (Ph) that is already implanted in the deposition process. This process is advantageous in that the process is relatively simple and the concentration distribution of the implanted phosphorus during the deposition is uniform. However, the amount of boron implanted to form the P+ polysilicon layer is excessive which makes it difficult to finely adjust the work function of the P+ polysilicon layer in the PMOS region. Because of these problems with the dual polysilicon gate forming method of implanting an impurity during the polysilicon deposition, a dual poly gate process of forming an N+ polysilicon layer and a P+ polysilicon layer by implanting impurities into the respective regions after forming an undoped polysilicon gate is applied according to an embodiment of the present invention.

Figure 2A:
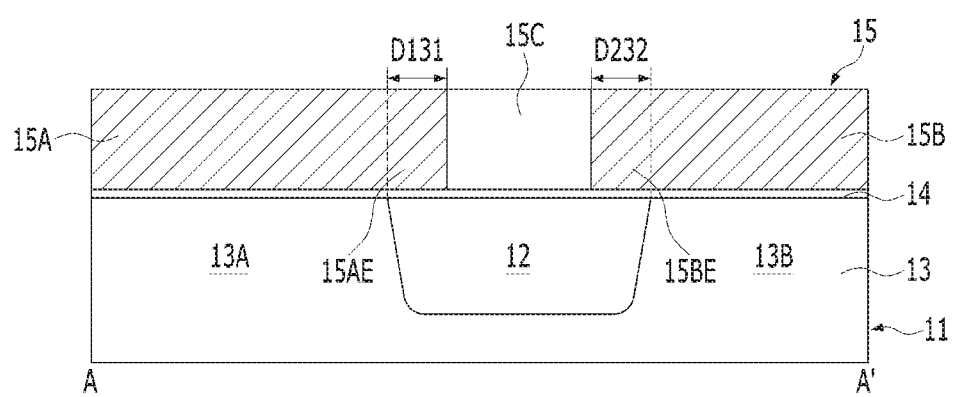
FIGS. 2A and 2B are cross-sectional views illustrating a semiconductor device in accordance with an embodiment of the present invention.
Figure 2B:
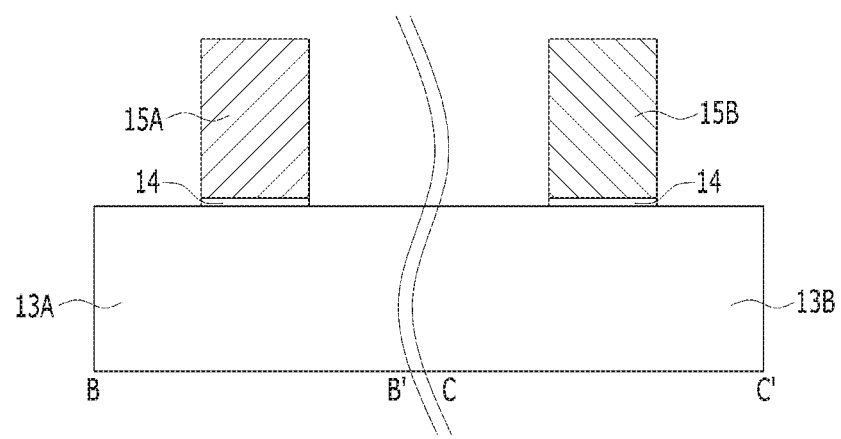
Figure 6:
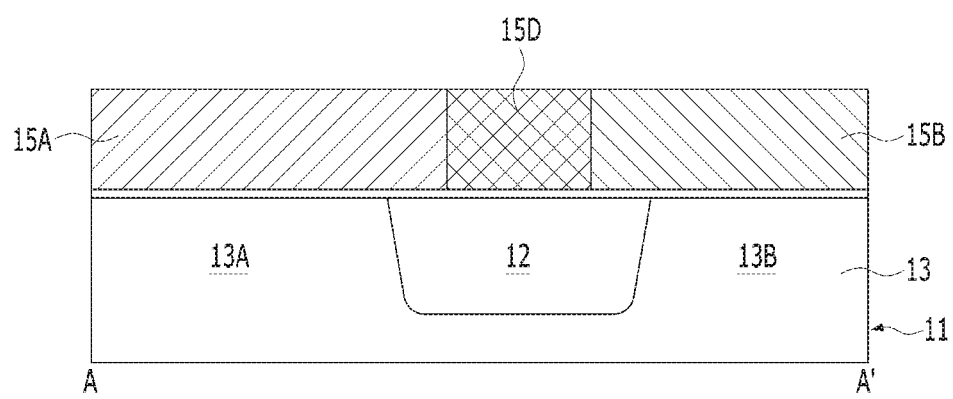
FIG. 6 is a cross-sectional view illustrating another example of the semiconductor device in accordance with an embodiment of the present invention.
Figure 7:
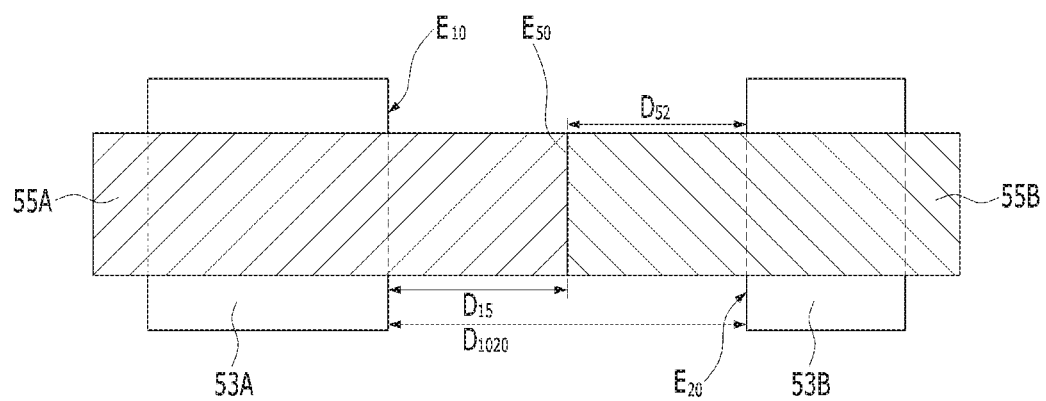
FIG. 7 is a plan view illustrating a semiconductor device according to a comparative example.
Figure 8:
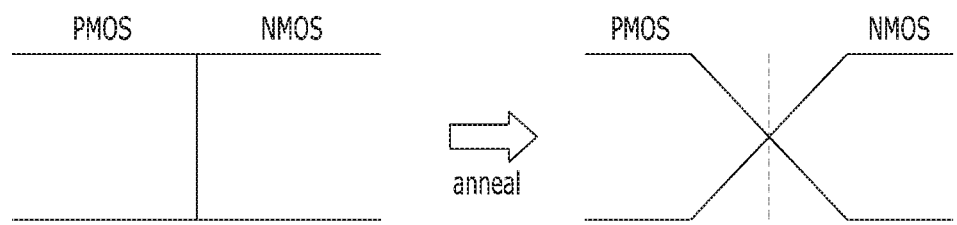
FIG. 8 is a graph showing a variation of an impurity concentration of a gate layer after heat diffusion of the semiconductor device according to the comparative example.

FIG. 1 is a plan view illustrating a semiconductor device in accordance with an embodiment of the present invention. FIGS. 2A and 2B are cross-sectional views illustrating a semiconductor device in accordance with an embodiment of the present invention. FIG. 2A is a cross-sectional view taken along a line A-A' shown in FIG. 1, and FIG. 2B is a cross-sectional view taken along a line B-B' and a line C-C'. FIG. 6 is a cross-sectional view illustrating another example of the semiconductor device in accordance with the embodiment of the present invention. FIG. 7 is a plan view illustrating a semiconductor device according to a comparative example. FIG. 8 is a graph showing a variation of an impurity concentration of a gate layer after heat diffusion of the semiconductor device according to the comparative example.

Referring to FIG. 1, a substrate 11 may include a first active region 13A, a second active region 13B, and an isolation region 12 positioned between the first active region 13A and the second active region 13B. Also, a gate layer 15 may be formed over the substrate 11 to cross over the first active region 13A, the second active region 13B, and the isolation region 12. The gate layer 15 may include a first impurity doped portion 15A overlapping with the first active region 13A and a first portion of the isolation region 12, a second impurity doped portion 15B overlapping with the second active region 13B and a second portion of the isolation region, and a diffusion barrier portion 15C positioned between the first impurity doping portion 15A and the second impurity doping portions 15B. According to an embodiment, the diffusion barrier portion 15C may overlap with a third portion of the isolation region 12 which is positioned centrally between the first and second portions of the isolation region 12.

The substrate 11 may include a semiconductor substrate. The substrate 11 may be formed, for example, of a material containing silicon.

An active region 13 may be defined by the isolation region 12. The isolation region 12 may be a shallow trench isolation region (STI) region formed by a trench etching process. The isolation region 12 may include, for example, silicon oxide, silicon nitride, or a combination thereof.

The first active region 13A and the second active region 13B may be regions for forming different types of MOS transistors. The active regions may be formed as the first active region 13A and the second active region 13B according to the conductivity type of the impurity implanted into the substrate 11. For example, the first active region 13A may be a PMOS region, and the second active region 13B may be an NMOS region. The width of the first active region 13A may be larger than that of the second active region. The first and second active regions 13A and 13B may be divided by the isolation region 12.

A gate dielectric layer 14 may be positioned between the gate layer 15 and the substrate 11.

The gate layer 15 may include a conductive material. The gate layer 15 may include polysilicon. The gate layer 15 may be formed in a shape of a continuous line crossing over the first active region 13A, the second active region 13B, and the isolation region 12.

The gate layer 15 may include the first impurity doped portion 15A overlapping with the first active region 13A, the second impurity doped portion 15B overlapping with the second active region 13B, and the diffusion barrier portion 15C positioned between the first impurity doped portion 15A and the second impurity doped portions 15B. To be specific, the first impurity doped portion 15A may overlap with the first active region 13A and may further include an extension portion 15AE partially overlapping the isolation region 12. The second impurity doped portion 15B may overlap with the second active region 13B and may further include an extension portion 15BE partially overlapping the isolation region 12. The diffusion barrier portion 15C may overlap with the isolation region 12 positioned between the first active region 13A and the second active region 13B.

The first impurity doped portion 15A and the second impurity doped portion 15B may have different diffusion coefficients. The first impurity doped portion 15A and the second impurity doped portion 15B may have the opposite conductivity types.

For example, when the first active region 13A is a PMOS region, the first impurity doped portion 15A may include a P-type impurity. The P-type impurity may include, for example, a group-3 element. The group-3 element may include, for example, boron (B). As shown in FIG. 2B, the first active region 13A may have a P-type gate in which the gate dielectric layer 14 and the first impurity doped portion 15A are stacked.

When the second active region 13B is an NMOS region, the second impurity doped portion 15B may include an N-type impurity. The N-type impurity may include, for example, a group-5 element. The group-5 element may include, for example, phosphorus (P). As shown in FIG. 2B, the second active region 13B may include an N-type gate in which the gate dielectric layer 14 and the second impurity doped portion 15B are stacked.

The diffusion barrier portion 15C may include an undoped region. The diffusion barrier portion 15C may serve to prevent the impurities implanted into the first and second impurity doped portions 15A and 15B from being diffused into the opposite regions.

Referring to FIG. 1, hereinafter, for the sake of convenience in description, an edge of the first active region 13A facing the diffusion barrier portion 15C may be represented by 'E1', and an edge of the second active region 13B facing the diffusion barrier portion 15C may be represented by 'E2', and an edge of the diffusion barrier portion 15C facing the first active region 13A may be represented by 'E31', and an edge of the diffusion barrier portion 15C facing the second active region 13B may be represented by 'E32'.

The edges E31 and E32 of the diffusion barrier portion 15C may be spaced apart from the edges E1 and E2 of the facing first and second active regions 13A and 13B. The width of the diffusion barrier portion 15C, that is, the distance between the edges E31 and E32 of the diffusion barrier portion 15C may be shorter than the distance D12 between the edge E1 of the first active region and the edge E2 of the second active region.

The distance D131 between the edge E1 of the first active region and the edge E31 of the diffusion barrier portion 15C that are facing each other may be shorter than the distance D132 between the edge E1 of the first active region and the edge E32 of the diffusion barrier portion 15C on the opposite side of the diffusion barrier portion.

The distance D232 between the edge E2 of the second active region and the edge E32 of the diffusion barrier portion 15C that are facing each other may be shorter than the distance D231 between the edge E2 of the second active region and the edge E31 of the diffusion barrier portion 15C on the opposite side.

The first and second active regions 13A and 13B may be spaced apart by a predetermined design rule to retain a processing margin. Hereinafter, the space between the first active region 13A and the second active region 13B may be called 'N-P space'. The distance (or width) of the N-P space may be represented by D12. The interface between the first impurity doped portion 15A and the second impurity doped portion 15B, that is, the diffusion barrier portion 15C, may be positioned in the N-P space, and the width of the diffusion barrier portion 15C may be adjusted to an effective distance as far as the inter-diffusion of the implanted impurities does not reach the active region on the opposite side even though the inter-diffusion of the implanted impurities occurs. In other words, the effective distance means a distance that the inter-diffusion in the first impurity doped portion 15A does not reach the second active region 13B, and also that the inter-diffusion in the second impurity doped portion 15B does not reach the first active region 13A. This design rule defines the space D231 of the first impurity doped portion 15A and the space D132 of the second impurity doped portion 15B.

As a comparative example, referring to FIG. 7, an interface E50 between the first impurity doped portion 55A and the second impurity doped portion 55B may be formed in contact. This is based on that the internal diffusion and the external diffusion phenomena occurring in the inter-diffusion are the same and, consequently, a space definition value and an overlap definition value in terms of the design rule are set the same. That is, the relationship between the space D52 of the first impurity doped portion 55A and the overlap D52 of the second impurity doped portion 55B, or the relationship between the space D15 of the second impurity doped portion 55B and the overlap D15 of the first impurity doped portion 55A, which are in a complementary relationship to each other, may be set the same. Also, it may not be assumed that the relationship between the space D52 of the first impurity doped portion 55A and the space D15 of the second impurity doped portion 55B, and, the value of the overlap D15 of the first impurity doped portion 55A and the value of the overlap D52 of the second impurity doped portion 55B may be the same. In other words, since the first impurity doped portion 55A and the second impurity doped portion 55B existing in the N-P space between the first active region 53A and the second active region 53B are complementary to each other, they may be designed without any overlapping region or a region that does not belong to any region. However, the position of the boundary E50 between the first impurity doped portion 55A and the second impurity doped portion 55B in the N-P space region may be arbitrary.

Since the thermal diffusion phenomenon of the impurities in the first and second impurity doped portions 55A and 55B is an inter-diffusion phenomenon, the phenomenon occurring at the interface between the first impurity doped portion 55A and the second impurity doped portion 55B may mean that an internal diffusion (diffuse-in) and an external diffusion (diffuse-out) occur simultaneously. Since the thermal diffusion inside a solid is a chemical equilibrium phenomenon occurring in a direction to offset a concentration difference, the inter-diffusion phenomena before and after the heat treatment may be schematically shown in FIG. 8. Referring to FIG. 8, it may be seen that the interface between the first impurity doped portion 55A and the second impurity doped portion 55B may be vertically detected before the heat treatment but, after the heat treatment, the concentration of each impurity may be distributed in an X shape according to the inter-diffusion phenomenon.

It is noted that the comparative example is based on a design technique assuming that the diffusion coefficients of the internal diffusion and the external diffusion in the inter-diffusion phenomenon are the same, and the diffusion coefficient of an impurity for substantially forming an impurity doped portion may differ according to the kind of the impurity. Particularly, since a silicide region is formed over polysilicon or a metal layer is bonded for the purpose of decreasing the resistance of a gate, the difference in the diffusion coefficients according to the structural situation of a gate electrode may also be large in a metal-silicon gate process.

Therefore, this embodiment of the present invention may be able to decrease the distance D12 of the N-P space, compared to the comparative example (in which the interface between the first impurity doped portion 55A and the second impurity doped portion 55B is formed in contact) by forming the diffusion barrier portion 15C, which is an undoped region, between the first impurity doped portion 15A and the second impurity doped portion 15B.

The variation in the effective doping concentration of the gate layer 15 in the first active region 13A and the second active region 13B that are adjacent to the interface between the first impurity doped portion 15A and the second impurity doped portion 15B may be defined by a space D231 of the first impurity doped portion 15A and a space D132 of the second impurity doped portion 15B defined by the internal diffusion of the impurities. Also, at the same time, it may be defined by the overlap D131 of the first impurity doped portion 15A (over the first active region) and the overlap D232 of the second impurity doped portion 15B (over the second active region), which are defined by the external diffusion of the impurities.

When a P-type impurity is applied as the first impurity doped portion 15A and an N-type impurity is applied as the second impurity doped portion 15B, the internal diffusion phenomenon of the impurities may appear much more after the heat treatment. Therefore, in this embodiment of the present invention, the N-P space value may be designed to be larger than the overlap definition value.

In this embodiment of the present invention, the first impurity doped portion 15A and the second impurity doped portion 15B may not be complementary, and there is an effect of making the space definition value larger than the overlap definition value in terms of the design rule by forming the diffusion barrier portion 15C, that is, an undoped region, between the first impurity doped portion 15A and the second impurity doped portion 15B. Therefore, even in an N-P space that is smaller than that of the comparative example, device characteristics may be secured without causing deterioration in the device performance that may occur due to inter-diffusion. Also, since the process of forming the diffusion barrier portion 15C adopts an independent mask process for forming the first impurity doped portion 15A and the second impurity doped portion 15B as it is, there may be no additional process or a change in the process.

As described above, according to the embodiment of the present invention, in a semiconductor device to which the dual poly gate process is applied, the first impurity doped portion 15A and the second impurity doped portion 15B may be independently set in consideration of the diffusion coefficients of the doped impurities. Therefore, it may be possible to prevent the performance deterioration of NMOS and PMOS caused by inter-diffusion and reduce the N-P space. Since a CMOS circuit formed of a combination of NMOS and PMOS has to be positioned adjacent to the NMOS region and the PMOS region, the decrease in the N-P space defined by the distance between the two regions may result in a reduction in the size of the basic layout elements that form the CMOS circuit. As a result, it is possible to obtain the effect of reducing the total circuit area.

Also, considering that the operation of the CMOS circuit is performed by signal transfer between the NMOS and the PMOS, the decrease of the N-P space may inevitably have an effect of shortening the length of a wiring layer formed for signal connection between the NMOS and the PMOS. The length of a wire used for signal transfer being shortened may mean that both resistance and capacitance of the wiring layer are decreased. This may decrease the time constant defined in a RC delay so as to raise the speed of the signal transfer rate between semiconductor devices. The fast signal transfer rate may improve the overall operation rate of a semiconductor circuit.

The difference in the diffusion coefficients between the internal diffusion and the external diffusion in the inter-diffusion phenomenon may appear due to various reasons, such as a case when the characteristics of the gate material are different, in particular, a case when a gate structure having a complex cross-sectional structure using a metal-silicon junction is used, a case when a different kind of an impurity other than the typical impurities specified as phosphorus or boron, or a case when an electrical inert impurity such as carbon (C), nitrogen (N) and fluorine (F) is implanted.

Therefore, according to another embodiment of the present invention, as shown in FIG. 6, the diffusion barrier portion 15D may include a neutral region in which both N-type and P-type impurities are doped. This is not the case where the diffusion coefficient of the internal diffusion is not greater than the diffusion coefficient of the external diffusion in the inter-diffusion phenomenon, which is the case of the embodiment of the present invention, but the opposite case, and thus the overlap definition value may be set larger than the space definition value in terms of the design rule.

FIGS. 3A to 3D are cross-sectional views illustrating a method for fabricating a semiconductor device in accordance with an embodiment of the present invention.

Figure 3A:
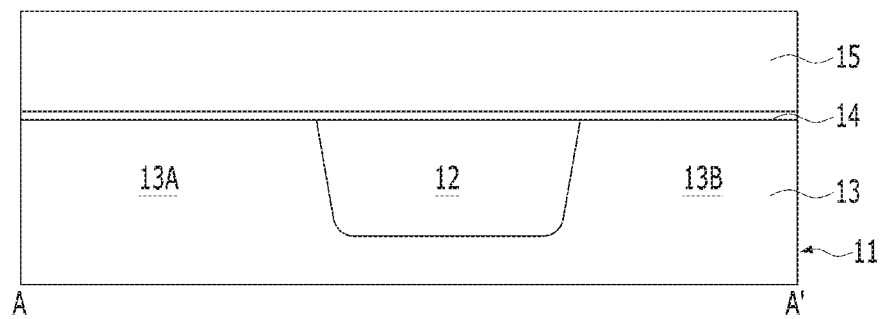
FIGS. 3A to 3D are cross-sectional views illustrating a method for fabricating a semiconductor device in accordance with an embodiment of the present invention.

Referring to FIG. 3A, an isolation region 12 and an active region 13 may be formed in a substrate 11.

The substrate 11 may include a semiconductor substrate. The substrate 11 may be formed, for example, of a material containing silicon. The substrate 11 may include, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof.

The active region 13 may be defined by the isolation region 12. The isolation region 12 may be a shallow trench isolation region (STI) region formed by a trench etching process. The isolation region 12 may be formed by filling a shallow trench, for example, an isolation trench, with a dielectric material. The isolation region 12 may include, for example, silicon oxide, silicon nitride, or a combination thereof.

The active region may be formed of a first active region 13A and a second active region 13B according to the conductivity type of the impurity implanted into the substrate 11. For example, the first active region 13A may be formed as a PMOS region, and the second active region 13B may be formed as an NMOS region.

Subsequently, a gate dielectric layer 14 may be formed over the substrate 11. In an embodiment, the gate dielectric layer 14 may be formed directly on the substrate 11 and be in contact with the top surfaces of the first and second active regions 13A, 13B and the isolation region 12. The gate dielectric layer 14 may include, for example, silicon oxide.

Subsequently, a gate layer 15 may be formed over the gate dielectric layer 14. The gate layer 15 may be formed directly on the gate dielectric layer 14. The gate layer 15 may include a conductive material. For example, the gate layer 15 may include polysilicon. The gate layer 15 may include undoped (intrinsic) polysilicon. The gate layer 15 may be formed, for example, by chemical vapor deposition (Chemical Vapor Deposition).

Figure 3B:
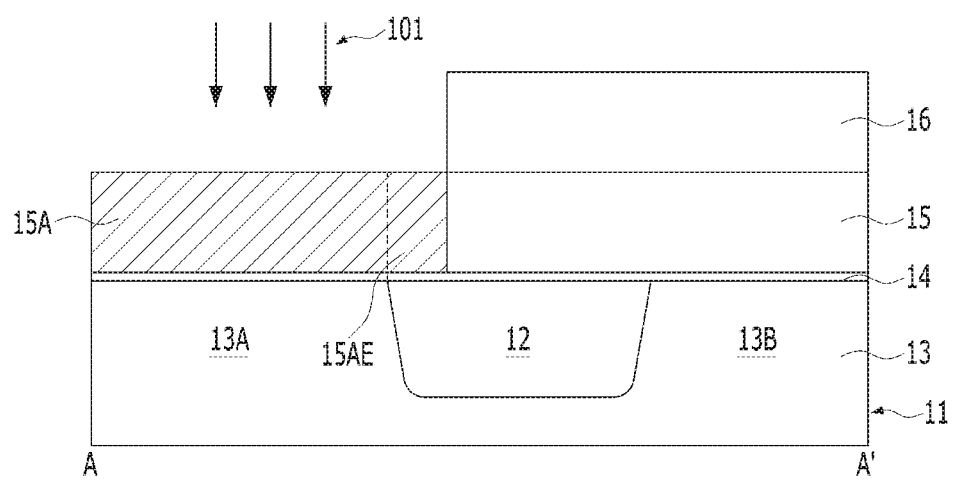

Referring to FIG. 3B, a first mask layer 16 may be formed over the second active region 13B and the isolation region 12. The first mask layer 16 may be formed directly on the second active region 13B and the isolation region 12. The first mask layer 16 may open the first active region 13A and a portion of the isolation region 12. This is to secure device characteristics that are resistant to process dispersion including alignment errors that may occur during the process.

Subsequently, a first ion implantation 101 for forming the first impurity doped portion 15A may be performed. When the first active region 13A is a PMOS region, the first impurity doped portion 15A may include a P-type impurity. The P-type impurity may include, for example, a group-3 element. The group-3 element may include, for example, boron (B).

Subsequently, although not illustrated, after the first ion implantation 101 is completed, the first mask layer 16 may be removed. When the first mask layer 16 includes a photosensitive film, the removal process of the first mask layer 16 may be performed by a strip process.

Figure 3C:
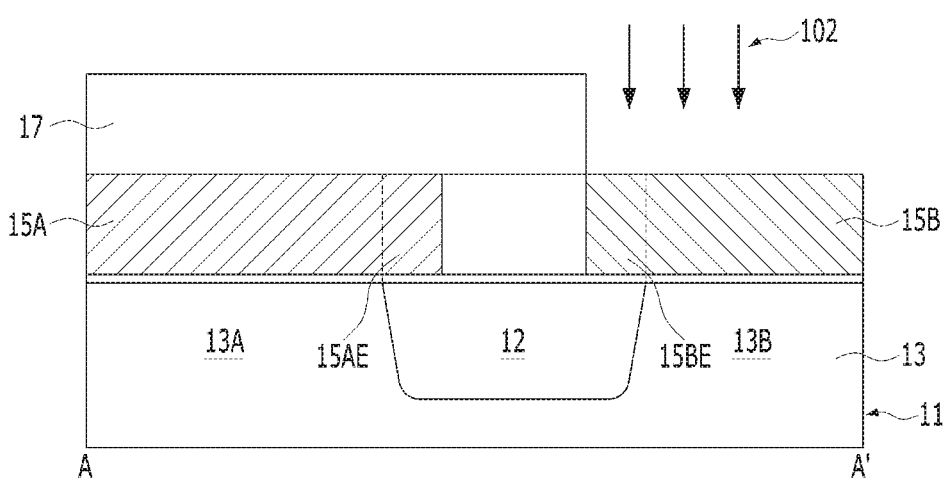

Referring to FIG. 3C, a second mask layer 17 may be formed over the first active region 13A and the isolation region 12. The second mask layer 17 may be formed directly on the first active region 13A and the isolation region 12. The second mask layer 17 may open the second active region 13B and a portion of the isolation region 12. This is to secure device characteristics that are resistant to process dispersion including alignment errors that may occur during the process.

Subsequently, the second ion implantation 102 may be performed to form the second impurity doped portion 15B. When the second active region 13B is an NMOS region, the second impurity doped portion 15B may include an N-type impurity. The N-type impurity may include, for example, a group-5 element. The group-5 element may include, for example, phosphorus (P).

Subsequently, although not illustrated, the second mask layer 17 may be removed after the second ion implantation 102 is completed. When the second mask layer 17 includes a photosensitive film, the removal process of the second mask layer 17 may be performed by a strip process.

Figure 3D:
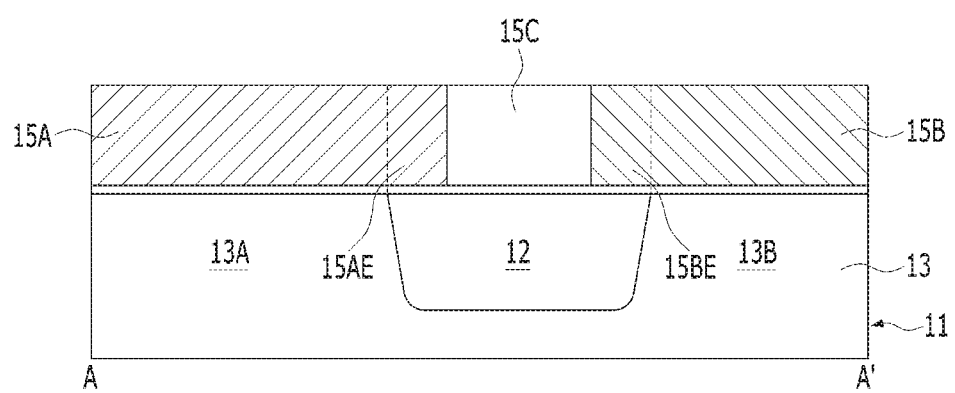

Referring to FIG. 3D, a first impurity doped portion 15A, a second impurity doped portion 15B, and a diffusion barrier portion 15C positioned between the first impurity doped portion 15A and the second impurity doped portion 15B may be formed through the first and second ion implantation (see 101, 102, FIGS. 3B and 3C). The diffusion barrier portion 15C may contact the first impurity doped portion 15A and the second impurity doped portion 15B. The diffusion barrier portion 15C may be maintained as an undoped region, since the gate layer 15 protected by the first and second mask layers (see 16, 17, FIGS. 3B and 3C) during the first and second ion implantation processes 101 and 102 is not doped with an impurity.

Figure 4:
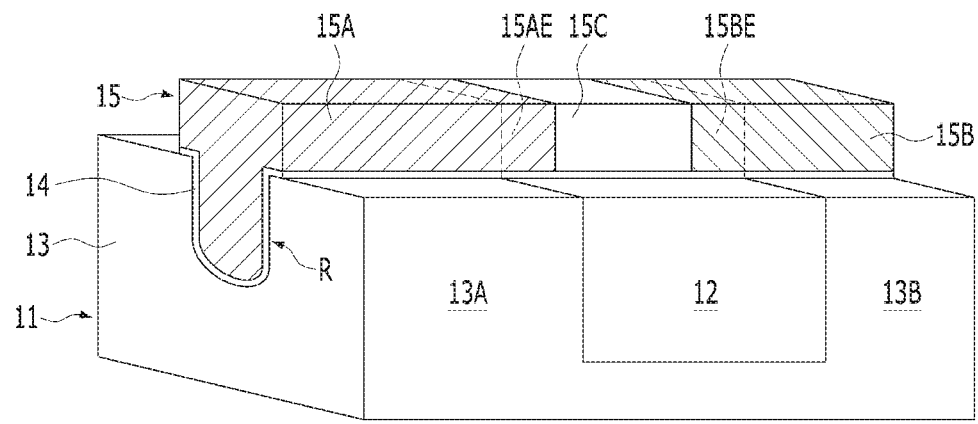
FIG. 4 is a perspective view illustrating another example of a semiconductor device in accordance with the embodiment of the present invention.

FIG. 4 is a perspective view illustrating another example of a semiconductor device in accordance with an embodiment of the present invention.

Referring to FIG. 4, a substrate 11 may include a first active region 13A, a second active region 13B, and an isolation region 12 positioned between the first active region 13A and the second active region 13B. Also, a recess pattern R may be formed in a gate region of the substrate 11. The recess pattern R may be formed to cross the first active region 13A, the second active region 13B, and the isolation region 12. Then, a gate layer 15 may be formed to gap-fill the recess pattern R and cross the first active region 13A, the second active region 13B, and the isolation region 12. The gate layer 15 may include a first impurity doped portion 15A overlapping with the first active region 13A, a second impurity doped portion 15B overlapping with the second active region 13B, and a diffusion barrier portion 15C between the first impurity doped portion 15A and the second impurity doped portions 15B. The first impurity doped portion 15A may further include an extension portion 15AE partially overlapping the isolation region 12. The second impurity doped portion 15B may further include an extension portion 15BE partially overlapping the isolation region 12. A gate dielectric layer 14 may be formed between the gate layer 15 and the substrate 11.

Figure 5:
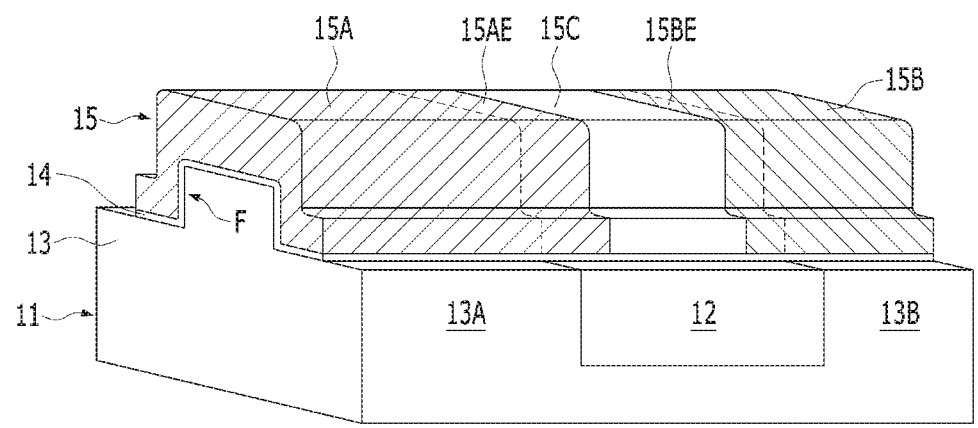
FIG. 5 is a perspective view illustrating yet another example of the semiconductor device in accordance with an embodiment of the present invention.

FIG. 5 is a perspective view illustrating yet another example of the semiconductor device in accordance with an embodiment of the present invention.

Referring to FIG. 5, a substrate 11 may include a first active region 13A, a second active region 13B, and an isolation region 12 positioned between the first active region 13A and the second active region 13B. Also, a fin pattern F may be formed in a gate region of the substrate 11. The fin pattern F may be formed to cross over the first active region 13A, the second active region 13B, and the isolation region 12. Also, a gate layer 15 covering the upper portion of the fin pattern F and crossing over the first active region 13A, the second active region 13B, and the isolation region 12 may be formed. The gate layer 15 may include a first impurity doped portion 15A overlapping with the first active region 13A, a second impurity doped portion 15B overlapping with the second active region 13B, and a diffusion barrier portion 15C between the first impurity doped portion 15A and the second impurity doped portions 15B. The first impurity doped portion 15A may further include an extension portion 15AE partially overlapping the isolation region 12. The second impurity doped portion 15B may further include an extension portion 15BE partially overlapping the isolation region 12. A gate dielectric layer 14 may be formed between the gate layer 15 and the substrate 11.

The first and second impurity doped regions 15A, 15B may cover the top surface and side surfaces of the fin region F of the respective first and second active regions 13A and 13B. The first and second impurity doped regions 15A, 15B may extend laterally away from the sides of the fin region F to cover a portion of the respective first and second active regions 13A and 13B.

According to an embodiment of the present invention, the reliability of a semiconductor device may be improved by preventing deterioration in the performance of a transistor.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
a substrate including a first active region, a second active region, and an isolation region positioned between the first active region and the second active region; and
a gate layer formed in a continuous line shape and crossing over the first active region, the second active region, and the isolation region,
wherein the gate layer includes
a first impurity doped portion overlapping with the first active region,
a second impurity doped portion overlapping with the second active region, and
a diffusion barrier portion positioned between the first impurity doped portion and the second impurity doped portion,
wherein the diffusion barrier portion is an undoped region.

2. The semiconductor device of claim 1, wherein the diffusion barrier portion overlaps with the isolation region.

3. The semiconductor device of claim 1, wherein an edge of the first active region and an edge of the diffusion barrier portion facing each other are spaced apart by a predetermined distance.

4. The semiconductor device of claim 1, wherein a distance between an edge of the first active region and an edge of the diffusion barrier portion facing each other is shorter than a distance between an edge of the first active region and an edge of the diffusion barrier portion on an opposite side.

5. The semiconductor device of claim 1, wherein an edge of the second active region and an edge of the diffusion barrier portion facing each other are spaced apart by a predetermined distance.

6. The semiconductor device of claim 1, wherein a distance between an edge of the second active region and an edge of the diffusion barrier portion facing each other is shorter than a distance between an edge of the second active region and an edge of the diffusion barrier portion on an opposite side.

7. The semiconductor device of claim 1, wherein a width of the diffusion barrier portion is smaller than a distance between an edge of the first active region and an edge of the second active region facing each other.

8. The semiconductor device of claim 1, wherein the gate layer includes polysilicon.

9. The semiconductor device of claim 1, wherein the first and second impurity doped portions have different diffusion coefficients.

10. The semiconductor device of claim 1, wherein the first and second impurity doped portions have opposite conductive types.

11. The semiconductor device of claim 1, wherein the first active region is an NMOS region, and the first impurity doped portion includes an N-type impurity.

12. The semiconductor device of claim 1, wherein the second active region is a PMOS region, and the second impurity doped portion includes a P-type impurity.

13. The semiconductor device of claim 1, wherein the substrate of the first and second active regions includes a recess pattern, and the gate layer gap-fills the recess pattern.

14. The semiconductor device of claim 1, wherein the substrate of the first and second active regions includes a fin pattern, and the gate layer covers an upper portion of the fin pattern.

15. A method for fabricating a semiconductor device, comprising:
providing a substrate including a first active region, a second active region, and an isolation region positioned between the first active region and the second active region;
forming a gate layer formed in a continuous line shape and crossing over the first active region, the second active region, and the isolation region;
forming a first impurity doped portion in the gate layer overlapping with the first active region;
forming a second impurity doped portion in the gate layer overlapping with the second active region; and
forming a diffusion barrier portion in the gate layer between the first impurity doped portion and the second impurity doped portion,
wherein the diffusion barrier portion is an undoped region.

16. The method of claim 15, wherein the forming of the first impurity doped portion in the gate layer overlapping with the first active region includes:
forming a first mask layer over the substrate of the isolation region and the second active region; and
performing a first ion implantation on the gate layer overlapping with the first active region.

17. The method of claim 15, wherein the forming of the second impurity doped portion in the gate layer overlapping with the second active region includes:
forming a second mask layer over the substrate of the isolation region and the first active region; and
performing a second ion implantation on the gate layer overlapping with the second active region.

18. The method of claim 15, wherein the gate layer includes polysilicon.

19. The method of claim 15, wherein the first and second impurity doped portions have different diffusion coefficients.

20. The method of claim 15, wherein the first and second impurity doped portions have opposite conductive types.

21. The method of claim 15, wherein the first active region is an NMOS region, and the first impurity doped portion includes an N-type impurity.

22. The method of claim 15, wherein the second active region is a PMOS region, and the second impurity doped portion includes a P-type impurity.

23. The method of claim 15, further comprising:
forming a recess pattern by etching the substrate of the first and second active regions, before the forming of the gate layer crossing the first active region, the second active region, and the isolation region.

24. The method of claim 15, wherein the substrate of the first and second active regions includes a fin pattern, and the gate layer covers an upper portion of the fin pattern.

25. A semiconductor device, comprising:
a substrate including a first active region, a second active region, and an isolation region positioned between the first active region and the second active region; and
a gate layer formed in a continuous line shape and crossing over the first active region, the second active region, and the isolation region,
wherein the gate layer includes
a first impurity doped portion overlapping with the first active region,
a second impurity doped portion overlapping with the second active region, and
a diffusion barrier portion positioned between the first impurity doped portion and the second impurity doped portion,
wherein the diffusion barrier portion is a neutral region in which both the first impurity and the second impurity are doped.

26. A method for fabricating a semiconductor device, comprising:
providing a substrate including a first active region, a second active region, and an isolation region positioned between the first active region and the second active region;
forming a gate layer formed in a continuous line shape and crossing over the first active region, the second active region, and the isolation region;
forming a first impurity doped portion in the gate layer overlapping with the first active region;
forming a second impurity doped portion in the gate layer overlapping with the second active region; and
forming a diffusion barrier portion in the gate layer between the first impurity doped portion and the second impurity doped portion,
wherein the diffusion barrier portion is a neutral region in which both the first impurity and the second impurity are doped.

* * * * *